United States Patent [19]
Couteaux et al.

[11] Patent Number: 6,137,309
[45] Date of Patent: Oct. 24, 2000

[54] EXCLUSIVE-OR LOGIC GATE WITH FOUR TWO-BY-TWO COMPLEMENTARY INPUTS AND TWO COMPLEMENTARY OUTPUTS, AND FREQUENCY MULTIPLIER INCORPORATING SAID GATE

[75] Inventors: Pascal Couteaux, Grenoble; Roland Marbot, Sassenage, both of France

[73] Assignee: STMicroelectronics S.A., Gentilly, France

[21] Appl. No.: 09/159,316

[22] Filed: Sep. 23, 1998

[30] Foreign Application Priority Data

Sep. 25, 1997 [FR] France ................................. 97 11956

[51] Int. Cl.$^7$ .................................................. H03K 19/21
[52] U.S. Cl. .............................................. 326/55; 331/53
[58] Field of Search ................................ 326/52, 54, 55; 331/53

[56] References Cited

U.S. PATENT DOCUMENTS 5,479,112  12/1995  Choi et al. .

FOREIGN PATENT DOCUMENTS 0 660 525 A1  12/1994  European Pat. Off. .

OTHER PUBLICATIONS

European Patent Abstract of Japanese Publication No. 57065927, published Apr. 21, 1982.
European Patent Abstract of Japanese Publication No. 61294934, published Dec. 25, 1986.
European Patent Abstract of Japanese Publication No. 05152936, published Jun. 18, 1993.
IBM Technical Disclosure Bulletin, vol. 30, No. 9, Feb. 1988, Armonk, New York, USA, pp. 17–19.
European Search Report dated May 18, 1998 with annex on French Application No. 97 11956.

*Primary Examiner*—Michael Tokar
*Assistant Examiner*—Daniel D. Chang
*Attorney, Agent, or Firm*—Theodore E. Galanthay; Stephen C. Bongini; Fleit, Kain, Gibbons, Gutman & Bongini P.L.

[57] ABSTRACT

An Exclusive-OR logic gate with four two-by-two complementary inputs and two complementary outputs. The structure of this Exclusive-Or gate is said to be symmetrical in that the gate has a propagation time that is identical whichever of the two pairs of complementary inputs is switched over, whatever the nature of the transition at output and whatever the logic state of the pair of inputs that do not switch over. The disclosed device enables a further reduction in the differences in the time taken for the propagation of the signal edges through the gate by eliminating the floating character of certain nodes. It also relates to a frequency multiplier comprising a tree of Exclusive-Or gates such as this.

17 Claims, 3 Drawing Sheets

FIG. 1
PRIOR ART

| A | B | NA | NB | XOR | NXOR |
|---|---|----|----|-----|------|
| 0 | 0 | 1  | 1  | 0   | 1    |
| 0 | 1 | 1  | 0  | 1   | 0    |
| 1 | 0 | 0  | 1  | 1   | 0    |
| 1 | 1 | 0  | 0  | 0   | 1    |

EXCLUSIVE-OR LOGIC GATE WITH FOUR TWO-BY-TWO COMPLEMENTARY INPUTS AND TWO COMPLEMENTARY OUTPUTS, AND FREQUENCY MULTIPLIER INCORPORATING SAID GATE

CROSS REFERENCE TO RELATED APPLICATIONS

This application is based upon and claims the benefit of the priority of the prior French patent application 97 11956 filed on Sep. 25, 1997, the contents of which are incorporated herein.

BACKGROUND OF THE INVENTION

1. Field of the Invention

The present invention relates to an Exclusive-OR logic gate with four inputs that are complementary in sets of two, hereinafter called "two-by-two complementary inputs," and two complementary outputs, as well as a frequency multiplier incorporating said gate.

It pertains to the field of the designing of integrated circuits for the processing and/or transmission of digital data.

It can be applied especially to frequency multipliers used for the transmission of digital data at high bit rates for serial links, as for example through optical fibers.

2. Description of the Related Art

At present, links of this kind are being obtained at bit rates that go up to some gigabits per second. The passband of the single-mode fibers commonly used in optical transmission systems is wide enough for their response not to distort the signal. In fact, it can be seen that it is the electronic circuitry in the transmitter and the receiver that constitutes a limit to the speed of transmission of the data. This is so especially with the frequency multipliers contained in the transmitter. There are known ways in the prior art of making a multiplier comprising a plurality of Exclusive-OR or XOR gates with four two-by-two complementary inputs and two complementary outputs arranged in a tree structure or arborescent structure. Reference may be made for example to the document EP-A-0 660 525. A periodic clock signal with a frequency $f_o$ is transmitted to the input of a sequence of N delay circuits positioned in series (N is preferably an integer power of 2, such that $N=2^p$, with p as an integer). Thus, at output of the delay circuits, there are generated periodic signals with the same frequency $f_o$ successively delayed by a duration equal to a fraction $1/N$ of the period $1/f_o$ of the clock signal. This group of N phase-shifted signals is equivalent to a single clock signal with a frequency $Nxf_o$. Thus, the clock frequency is subjected to a frequency multiplication by N. These N signals are used for the sampling, at the frequency $Nxf_o$, of each of the N bits, constituting a data word to be transmitted in series, that arrive at given bit rate. The signals constituting the result of these sampling operations and their complementary logic signals are successively transmitted to the pairs of complementary inputs of at least $2^{p-1}$ Exclusive-OR gates. These Exclusive-OR gates constitute the first layer of the tree structure. It is seen to it that signals sampled by sampling signals in phase or in phase opposition are not applied to the two pairs of complementary inputs of one and the same gate. It is ensured that the two pairs of complementary inputs of the gate do not change their logic state simultaneously. Each of the next layers successively comprises a number of gates that is half as small as the layer preceding it, the last layer of the tree having only one gate. The tree therefore has p layers of gates. The output signals of the gates of a specific layer are transmitted to the input of the gates of the next layer so that the two pairs of complementary inputs of each gate do not receive pairs of complementary signals that simultaneously change their logic state. The digital data elements to be transmitted are then available at the output of the gate of the last layer with a bit rate that is N times greater than the initial bit rate.

It is known that, to limit the distortion of the string of bits to be transmitted, it is necessary to limit the difference in the time taken for the propagation of each of the bits through the tree of Exclusive-OR gates. Now, with the tree structure described here above, each bit goes through an identical number of gates in the tree. It can furthermore be seen to it that the length of the connections between the gates of two successive layers of the tree is identical so that, whatever the path of propagation of a signal edge through the tree, the load constituted by these connections is identical.

What remains to be done therefore is to equalize the time of propagation of any bit through each Exclusive-OR gate of the tree. This amounts to searching for an Exclusive-OR gate structure that has a propagation time that is identical, whichever of the two pairs of complementary inputs may be switched over, whatever may be the nature of the transition at output and whatever may be the logic state of the pair of inputs that do not switch over (and remain stable during the switching). By convention, a structure of this kind is hereinafter called a symmetrical structure.

The document EP-A-0 660 525 describes an Exclusive-OR gate with four two-by-two complementary inputs and two complementary outputs that may be called symmetrical according to the definition indicated here above. The structure of the gate disclosed by this document which shall be described in greater detail in the following description (with reference especially to FIG. 4) is designed to equalize the charge applied to each of the inputs, whatever may be the logic state of the other inputs and whatever may be the nature of the transition at output of the gate.

However, the document EP-A-0 660 525 indicates that the periods of time taken for the propagation of the signal edges in a tree comprising Exclusive-OR gates of this kind have been equalized through the gate structure with a precision of only some tens of picoseconds. This means that, depending on the development in time of the configuration of the inputs of the tree, the signal edge to be propagated gets propagated with a propagation time that may vary with a similar lack of precision. In simulation, the inventors have observed that this lack of precision is in fact in the range of 70 picoseconds. Such a value of imprecision is still far too high for the accurate transmission of the data elements in serial form at a high bit rate (in the range of some gigabits per second). This point is even more valid if it is sought to further increase the value of the bit rate of the data elements transmitted.

The aim of the present invention is to overcome this drawback. More specifically, the invention is designed to seek the possible causes of variation in the periods of time taken for the propagation of the signal edges through an Exclusive-OR gate of the type disclosed in the document EP-A-0 660 525 and to propose means to overcome this variation.

To this end, the invention has implied, for the inventors, first of all the performance of lengthy and painstaking studies on the electrical behavior of the prior art Exclusive-OR gate which, according to the document EP-A-0 660 525, is nevertheless structurally and functionally symmetrical. Through the analysis of the behavior of this gate, in both static and dynamic modes, within a tree structure as described here above, the inventors have been able to uncover the cause of the differences observed in time taken for the propagation of the signal edges depending on the development of the logic state of the inputs of the tree in the course of time. Indeed, from the analyses performed, it has been deduced that, as a function of the logic state of the inputs of the Exclusive-OR gate, certain nodes of the circuit of the gate may be floating. Depending on the development of the logic state of the inputs, these nodes are charged, each in its turn, with given potentials and discharged by (P type or N type) MOS transistors to whose drains they are connected when these transistors are conductive. However, when these nodes are connected to the drains of transistors that remain non-conductive for a certain period of time depending on the development of the logic state of the inputs in the course of time, these nodes are liable to get discharged in an uncontrolled manner. More specifically, the internal capacitance of the transistors, and especially the drain/substrate capacitance which may be preponderant, gets discharged owing to the leakage currents. The result thereof is that, when a signal edge gets subsequently propagated through the gates (in which it may or may not be inverted, this being of little importance) the nodes in question are charged or discharged from an initial value that varies according to the chronology of the development of the state of the inputs of the gate.

Accordingly, a need exists for a solution for the above shortcomings in the art.

SUMMARY OF THE INVENTION

Briefly, in accordance with an aspect of the invention, the above discussed phenomenon has been identified as being a cause of the lack of precision in the time taken for the signal edges to be propagated through the gate. Accordingly, to remedy this drawback, an Exclusive-OR gate comprises a first supply node, a second supply node, a first cell, a second cell, and a mechanism for eliminating the floating state of an intermediate node. The gate has four two-by-two complementary inputs A and NA, and B and NB and two complementary outputs XOR and NXOR. Each of the cells comprises an output node, a first P type arm, a second P type arm, a first N type arm, and a second N type arm. In each cell, the two P type arms are parallel-connected and each arm comprises a first P type MOS transistor and a second P type MOS transistor. These two P type MOS transistors are series-connected between the output node of that cell and the first supply node. In each cell, the two N type arms are parallel-connected and each arm comprises a first N type MOS transistor and a second N type MOS transistor. These two N type MOS transistors are series-connected between the output node of that cell and the second supply node. The node between the two series-connected transistors of each arm in each cell is an intermediate node. The control gates of the two transistors of each arm of each cell are coupled to receive only one of the four pairs of inputs {A,B}, {NA,B}, {A,NB}, or {NA,NB}, or the reverse of one of these four pairs. The two same-type arms of a cell receive two-by-two complementary input pairs. The two N type arms of the first cell are coupled to receive the same pairs of inputs as the two P type arms of the second cell. The two P type arms of the first cell are coupled to receive the same pairs of inputs as the two N type arms of the second cell.

BRIEF DESCRIPTION OF THE DRAWINGS

Other features and advantages of the present invention shall also appear from the following description. This description is given purely by way of an illustration with reference to the appended drawings, of which.

DETAILED DESCRIPTION OF A PREFERRED EMBODIMENT

1. Overview

The present invention relates to an Exclusive-OR gate with four two-by-two complementary inputs A and NA, and B and NB, and two complementary outputs XOR and NXOR in which two cells each comprise two parallel-connected arms (also referred to as branches) of a first type (P type) each comprising a first P type MOS transistor and a second P type MOS transistor series-connected between a higher supply terminal and an output node and separated by an intermediate node, and two arms, also parallel-connected, of a second type (N type), each arm comprising a first N type MOS transistor and a second N type MOS transistor series-connected between the output node and a lower supply terminal and separated by an intermediate node; the control gates of the two transistors of each of the four arms of each cell receive exclusively one of the four pairs of inputs {A,B}, {NA,B}, {A,NB}, or {NA,NB}; the two arms of one and the same cell that are of the same type receive two-by-two complementary input pairs; finally the two arms of an unspecified type (P type or N type respectively) of a given cell respectively receive the two same pairs of inputs as the other two arms of the other cell which are of the other type (the N type or P type respectively). To each arm of the cells, there is furthermore parallel-connected an arm of the same type called a twin arm of said arm. The first and second transistors of this twin arm receive, at their control gate, the pair of inputs that is the reverse of the pair of inputs received by the control gates of the transistors of said arm. Furthermore, in each cell, the intermediate node of any one of the arms of a given type (P type or N type) is connected to the intermediate node of the arm that is the twin of the other same-type arm of the cell.

Through the combination of these two last characteristics, new paths are created between the intermediate nodes on the one hand and the output nodes of the supply terminals on the other hand. It will be observed, in the light of the following description, that these arms impose a potential on these intermediate nodes when the transistors of the arm considered are non-conductive. We have thus eliminated the floating character of these nodes in this configuration of the input signal. Furthermore, the logic operation of the gate is not modified inasmuch as the new paths created between, firstly, the output nodes of each cell and, secondly, the higher or lower supply terminals are never conductive.

The output node of one of the cells constitutes the output XOR of the gate while that of the other cell constitutes its complementary output NXOR.

2. Development

The Exclusive-OR gate according to the invention is made by so-called CMOS (Complementary Metal-Oxide Semiconductor) technology. This technology combines the use of P type MOS transistors and N type MOS transistors. The basic structure of an Exclusive-OR gate made according to CMOS technology can easily be deduced from the basic structure of an inverter made according to this technology (FIG. 1) on the one hand, and from the truth table of the Exclusive-OR function on the other hand (FIG. 2).

Figure 1:
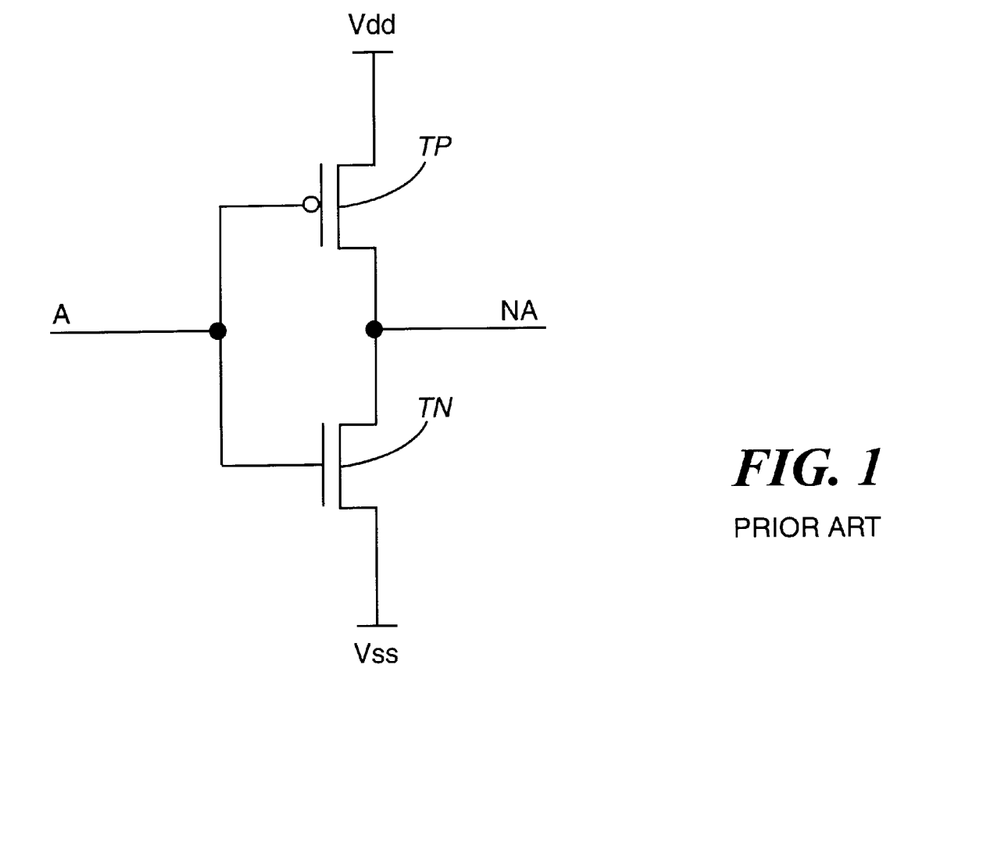
FIG. 1 shows a standard diagram of an inverter using CMOS technology.
Figure 2:
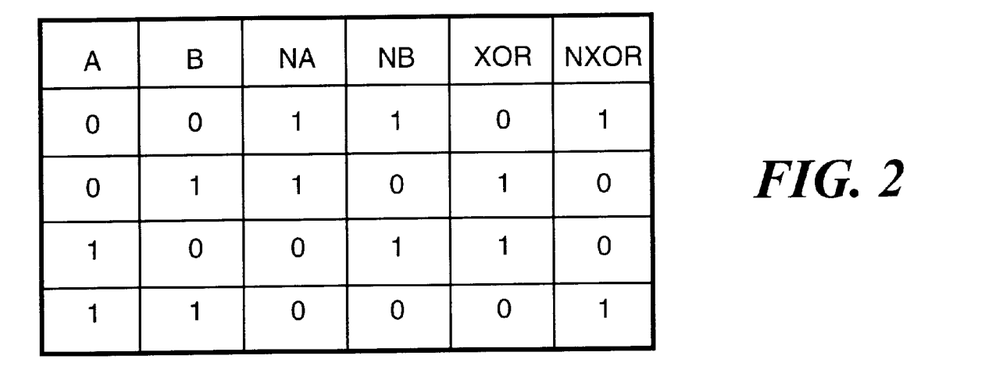
FIG. 2 shows the truth table of the Exclusive-OR function with four two-by-two complementary inputs and two complementary outputs.

In FIG. 1, the basic inverter made by CMOS technology includes a P type MOS transistor (referenced TP with a small circle drawn on its control gate to distinguish it from a transistor of the other type) and an N type MOS transistor (referenced TN) series-connected between two supply terminals. The source of the transistor TP is connected to a higher supply terminal coupled to a potential Vdd and its drain is connected to an output node. The source of the transistor TN is connected to a lower supply terminal coupled to a potential Vss lower than Vdd or to the ground and its drain is connected to the output node. The input signal A is taken at the common control gates of these two transistors. The output signal NA, which is the complementary signal of the input signal A, is available at the output node common to the drains of the two transistors.

When the input signal A is in the logic state 0, the transistor TP is conductive and the transistor TN is non-conductive. The output node is then taken to the potential Vdd so that the output signal NA is in the logic state 1. Conversely, when the input signal A is in the logic state 1, the transistor TP is non-conductive and the transistor TN is conductive. The output node is then taken to the potential Vss so that the output signal NA is in the logic state 0. When the input signal is stable, no current flows in the source/drain paths and drain/source paths of the transistors TP and TN respectively. The static consumption is therefore zero. The transistors consume no current except during the phases of transition from one logic state to another (the dynamic consumption of the gate is not zero). The P type transistor ensures the operations of switching the output from the logic state 0 to the logic state 1 (corresponding to rising edges at output or 0-1 transition). The N type transistor on the contrary provides for the switching of the output from the logic state 1 to the logic state 0 (corresponding to falling edges at output or 1-0 transition).

The above observations illustrate the main advantage of the CMOS technology which lies in the fact that there is no static current consumption. At the same time they illustrate its inherent drawback resulting from the difference in performance characteristics in terms of current of the transistors which charge the output node during the 0-1 transitions on the one hand and the 1-0 transitions on the other. Indeed, the mobility of the carriers of the N type transistor (the electrons) is 2.5 times greater than that of the carriers of the P type transistor (the holes). For transistors having the same channel width, the charging current of an N type transistor is therefore 2.5 times greater than that of a P type transistor. Now this current determines the charging speed of the parasitic capacitances of the transistors, especially the drain/substrate capacitance. The result of this is that the 0-1 transition at output of the inverter is slower than the 1-0 transition.

FIG. 2 shows the truth table of the Exclusive-OR function. The value of the function is given for the output variable XOR as a function of the logic value of two distinct input variables A and B. The table also brings out the values of the variables NA, NB and NXOR which are complementary respectively to the variables A, B and XOR.

It is known, and this can be easily verified by means of the truth table of FIG. 2, that the value of the output variable XOR is given by the expression NA*B+A*NB, where the sign * symbolizes the AND logic function and the sign +symbolizes the OR logic function. Symmetrically, it is also possible to verify that the value of the output table NXOR is given by the expression A*B+NA*NB. It will therefore be seen that the XOR or NXOR functions can be fulfilled by means of the signals A and B and their respective complementary signals NA and NB by drawing inspiration from the basic structure of the CMOS technology inverter shown in FIG. 1.

It will be noted that it is advantageous to have an Exclusive-OR gate with four two-by-two complementary inputs, i.e. a gate with two pairs of complementary inputs, A and NA on the one hand and B and NB on the other hand, and two complementary outputs XOR and NXOR. Indeed, referring now to FIG. 3, the Exclusive-OR gate 11 has two cells 11a and 11b with an identical structure but working symmetrically so that one generates the output XOR from the inputs A, NA, B and NB while the other generates the complementary output NXOR from the same inputs. This identity of structure and this symmetry in the operation contribute to the obtaining of a response time of the outputs that is independent of the pair of inputs A and NA and B and NB that switch over, independent of the nature of the transition 1-0 or 0-1 on that output of the outputs XOR or NXOR which is being considered and independent of the logic state of the complementary pair of inputs which do not switch over. The notion of a symmetrical gate is defined in the case of a gate with four two-by-two complementary inputs and two complementary outputs by the characteristic of threefold independence with respect to the response time of the outputs as specified here above. Furthermore, since the Exclusive-OR gate is for example designed to be used in a tree of identical gates, as described further above, in which the gates are cascade-connected, it is advantageous that it should itself generate, at its outputs, the complementary signals XOR and NXOR which constitute one of the pairs of complementary inputs of a gate of the following layer in the tree. This removes the need to use an inverter to generate the complementary signal of the signal XOR.

Figure 3:
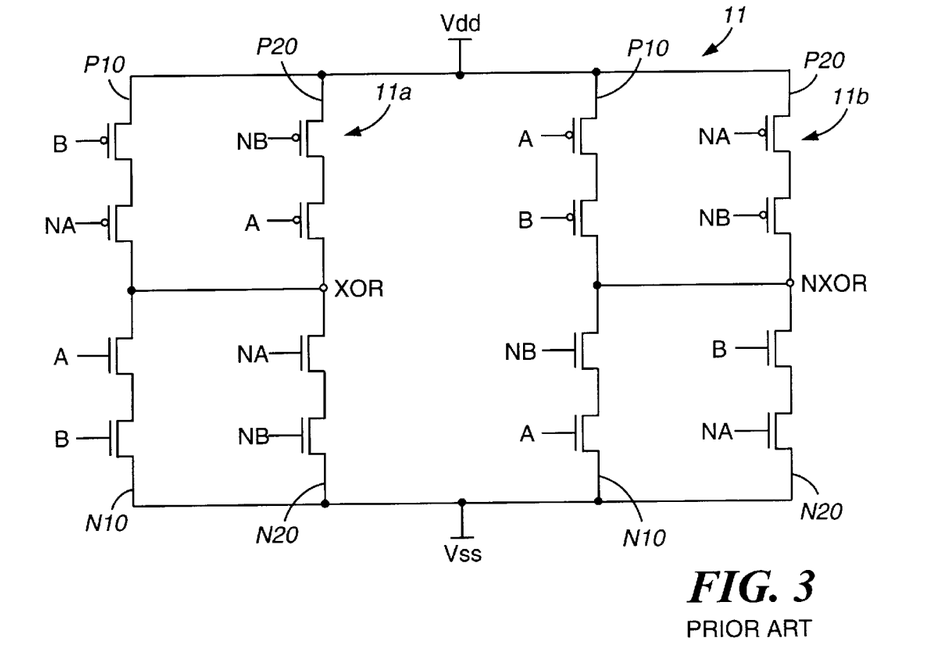
FIG. 3 shows the basic structure of an Exclusive-OR gate with four two-by-two complementary inputs and two complementary outputs XOR and NXOR (according to the prior art)

FIG. 3 shows the basic structure of an Exclusive-OR gate with four two-by-two complementary inputs and two complementary outputs XOR and NXOR according to the prior art illustrated by the document EP-A-0 660 525. Each cell 11a and 11b has four arms: two P type arms referenced P10 and P20, designated thus hereinafter because they include two series-connected P type MOS transistors which are connected in parallel between the higher supply terminal and the output node of the cell; and two N type arms referenced N10 and N20, designated thus hereinafter because they include two series-connected N type MOS transistors which are connected in parallel between the output node of the cell and the lower supply terminal. The two same-type transistors of each arm are separated by an intermediate node.

It will be considered hereinafter that the output node of the first cell 11a delivers the output XOR of the gate while the output node of the second cell 11b delivers the output NXOR of the gate.

When the two transistors of one and the same arm are conductive, it is said that the arm is conductive. It is this arm that imposes the potential on the output node. It will be seen that, whatever the logic state of the four two-by-two complementary inputs, only one arm per cell is conductive at a given instant.

The control gates of the two transistors of each of the four arms P10, P20, N10, N20 of each cell receive exclusively one of the four pairs of inputs {A,B}, {NA,B}, {A,NB}, or {NA,NB}. The term "exclusively" is understood to mean that, within a given cell, a pair of transistors of a single arm receives any one of the above four pairs of inputs and that each of these pairs of inputs is assigned to the two transistors of only one of the four arms of the cell.

For each cell 11a or 11b whose output respectively delivers the signal XOR or NXOR, the pairs of inputs to be taken to the gates of the transistors of each of the four arms can easily be conceived from the truth table of FIG. 2 (it being recalled that this XOR function is given by the expression A*NB+NA*B, it being furthermore observed that a series connection of two P type MOS transistors between the higher supply terminal on the one hand and the output node on the other hand, which receive two unspecified signals at their control gates, generates the result of the AND operation between said signals at the output node, and it being finally observed that the parallel connection of two P type MOS transistors between the higher supply terminal and the output node, receiving two unspecified signals at their control gate, generates the AND function between said signals). For example, for the cell 11a delivering the signal XOR at output, it will be understood that the two P type MOS transistors of the arm P10 respectively receive the inputs NA and B at their control gates while the two P type MOS transistors of the arm P20 receive the two inputs A and NB, the two N type transistors of the arm N10 respectively receiving the inputs A and B and the two N type transistors of the arm N20 receiving the two inputs NA and NB. Symmetrically, for the cell 11b whose output node delivers the output NXOR, the two P type transistors of the arm P10 receive the two inputs A and B at their control gates while the two P type transistors of the arm P20 receive the two inputs NA and NB, the two N type transistors of the arm N10 receiving the inputs A and NB and the two N type transistors of the arm N20 receiving the two inputs NA and B.

The assignment of the different pairs of inputs to the different arms of a given cell of a gate can be summarized by the statement of the following characteristics:

the control gates of two transistors of each of the four arms of each cell receive exclusively one of the four pairs of inputs {A,B}, {NA,B}, {A,NB}, or {NA,NB};

the two arms of one and same cell that are arms of the same type (the P type arms P10 and P20 or the N type arms N10 and N20) receive pairs of two-by-two complementary inputs (for example the pair {B,NA} and the pair {NB,A} for the P type arms of the first cell 11a);

the two arms of an unspecified type (for example the P type) of a given cell (for example the cell 11a) respectively receive the same two pairs of inputs as the two arms of the other cell (the cell 11b) which are of the other type (N type).

This basic structure of an Exclusive-OR gate with four two-by-two complementary inputs and two complementary outputs has already been improved in the prior art so as to make the structure of the gate symmetrical from an electrical point of view (see EP-A-0 660 525).

The improvement comes from the modification of the structure of the gate which consists of the parallel connection, to each arm of the gate, of another same-type arm called a twin arm of said arm, the transistors of this twin arm receiving, at their control gate, the pair that is the reverse of the pair of inputs received by the control gate of the transistors of the arm. The pair that is the reverse of an unspecified pair of inputs {X,Y} is defined as the pair {Y,X}. The notion of a pair of inputs is therefore a notion that makes use of a relationship of order between these inputs. More simply, this notion will be expressed by emphasizing the following point: if, within a given arm, the first transistor located on the supply terminal side and the second transistor located on the output node side receive the pair of inputs {X,Y} i.e. if respectively, the first transistor receives the input X and the second transistor receives the input Y, then in the arm that is the twin of said arm, the first transistor located on the supply terminal side and the second transistor located on the output node side receive the reverse pair {X,Y}, i.e. respectively the first transistor receives the input Y and the second transistor receives input X. Thus, in FIG. 4 according to the prior art, a twin arm P11 is parallel-connected to the arm P10 of each cell 11a or 11b, a twin arm P21 being parallel-connected to the arm P20 while a twin arm N11 is parallel-connected to the arm N10 and an arm N21 is parallel-connected to the arm N20, the two transistors of each twin arm receiving the pair that is the reverse of the pair of inputs received by the transistors of each of the arms with which it is associated.

Figure 4:
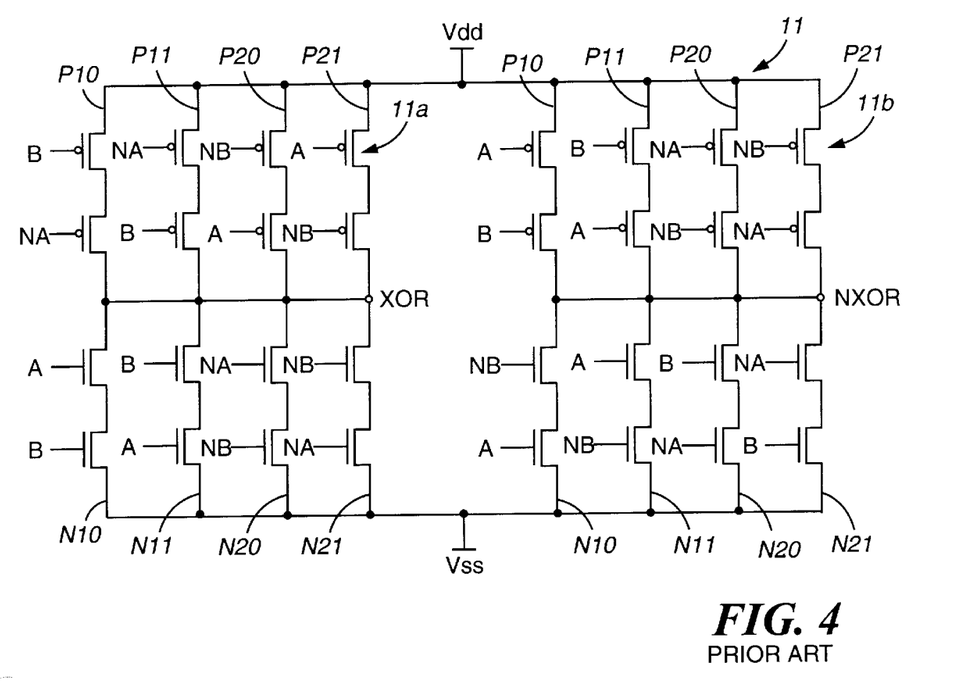
FIG. 4 shows the structure of a gate of this kind modified so as to make it symmetrical (according to the prior art)

This arrangement makes it possible to equalize the impedance perceived by each input A, NA, B or NB from a dynamic viewpoint. Indeed, within each cell 11a or 11b, the impedance seen by each input is the equivalent impedance of a P type transistor (the one close to the higher supply terminal) in parallel with two series-connected P type transistors, the entire assembly being parallel-connected with the impedance of an N type transistor (the one close to the lower supply terminal) in parallel with two N type transistors. For further details on the effects of the twin arms on the symmetrization of the impedance seen by each input of the gate, reference may be made to the document EP-A-0 660 525.

Without ceasing to fulfil their impedance equalization function described here above, the twin arms are arranged according to the invention so as to fulfil a new function that can be used to eliminate the floating character which may be displayed by the intermediate node of each of the arms.

This floating character of certain intermediate nodes may be highlighted by considering again FIG. 3 which is simpler and therefore easier to describe than FIG. 4. For this explanation, we shall consider only the cell 11a. Let it be assumed that, at a given instant, the input A has the logic value 0 just like the input B. The inputs NA and NB therefore both have the logic value 1. Consequently, it is the N type arm N20, whose transistors respectively receive the inputs NA and NB, that is conductive and dictates the state of the output node. The potential at the output node XOR is indeed substantially equal to the potential Vss. The potential at the intermediate node of the arm N20 is substantially equal to the potential Vss. The two transistors of the arm N10 adjacent to the arm N20 which is conductive are non-conductive, receiving signals in the logic zero state at their control gate. The intermediate node of the arm 10 is therefore a floating node. In the P type arm P10, the transistor close to the higher supply terminal which receives the input B is conductive so that the potential at the intermediate node of this arm is substantially equal to the potential Vdd. Conversely, in the other P type arm P20, it is the transistor close to the output node receiving the input A that is conductive so that the potential of the intermediate node of said arm is substantially equal to the potential of the output node of the cell which, as it happens, is a potential close to Vss. It will thus be noted that only the intermediate node of the arm N10 adjacent to the arm N20 which is conductive is a floating node, the other nodes being taken to specified potentials. The potential at the intermediate node of the arm N10 has an initial value depending in the prior state of the four inputs A, NA, B and NB. The potential at the intermediate node of the arm N10 is maintained only by the effect of the parasitic capacitances of the transistors and especially the effect of the drain/substrate capacitance (the substrate being taken to the potential Vss for the N type transistors and to the potential Vdd for the P type transistors). Assuming that the inputs remain within the configuration envisaged for a sufficient period, this potential will drop owing to the leakage current. Thus, when one of the two inputs A and B goes back to the logic state 1, in such a way that the two transistors of the arm N10 become conductive, the intermediate node must be charged to a potential close to Vdd (if it is the input A that has gone to the logic state 1) or discharged to a potential close to Vss (if it is the input B that has gone back to the logic state 1) from an initial potential whose value will depend on the duration (an indeterminate duration) during which the two inputs A and B have remained in the logic state 0. Thus, the time needed to charge or discharge the intermediate node of the arm N10 is variable depending on the chronology of the development of the logic state of the inputs. Then, as the case may be, when the other input also goes back to the logic state 1 so that the arm N10 becomes conductive, it is the potential at the output node that will start from an indeterminate value. This therefore implies differences in the switching time of the output XOR of the gate, depending on the chronology of the development of the logic state of the input. It is quite clear that this phenomenon takes place only for high values (some gigabits per second) of the bit rate of the data going through the gate.

The invention proposes means that make it possible, in all circumstances, to impose a potential on the intermediate nodes at each arm. These means include the twin arms described here above with reference to FIG. 4 but arranged in a novel way by which they can fulfil a novel function, other than that of equalizing the impedance perceived by each of the inputs. This arrangement according to the invention can be seen in FIG. 5. In each cell, the intermediate node of any one of the arms of a given type (P type or N type) is connected to the intermediate node of the arm that is the twin to the other same-type arm of this same cell. For example, the intermediate node of the P type arm P10 is connected to the intermediate node of the twin arm P21 of the other P type arm P20 of the cell. Again, the intermediate node of the P type arm P20 is connected to the intermediate node of the twin arm P11 of the other P type arm P10 of the cell. In the same way, the intermediate node of the N type arm N10 is connected to the intermediate node of the twin arm N21 of the other N type arm N20 of the cell. And finally, the intermediate node of the N type arm N20 is connected to the intermediate node of the twin arm N11 of the other N type arm N10 of the cell.

Figure 5:
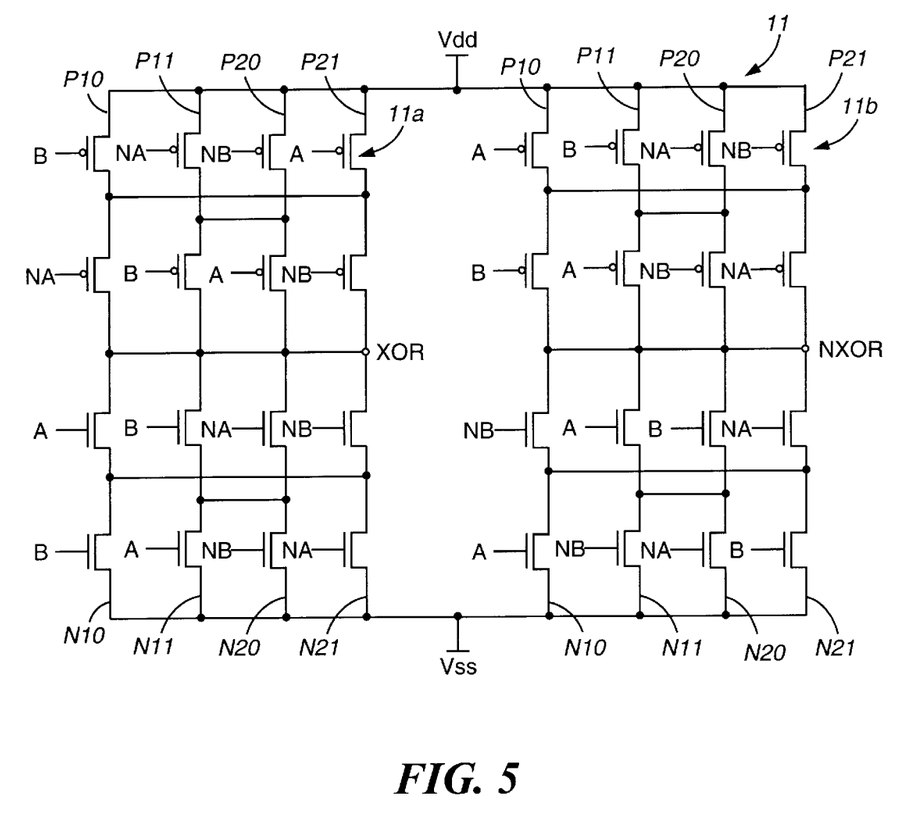
FIG. 5 shows an embodiment of an Exclusive-OR gate according to the invention.

Thus, four paths have been created between the supply terminals and the output node of the cell. These connections have the effect of imposing a potential on the intermediate node of the arm adjacent to that arm, of the four arms of the cell, which is conductive depending to the logic state of the four inputs. Thus, if we again take up the example considered above in order to highlight the floating character of this intermediate node in which the inputs A and B were in the logic state 0 in such a way that the intermediate node of the arm N10 of the cell 11a was floating, it is observed that the potential at this intermediate node is henceforth imposed by the potential of the intermediate node of the arm N21, this arm N21 being conductive owing to the fact that its transistors receive, at their control gate, the pair of inputs {NA,NB} that are in the logic state 1. This intermediate node is taken, as it happens, to a potential substantially equal to Vss, so that the intermediate node of the arm N10 is discharged at the potential Vss. More generally, it can be shown that the connections between the intermediate node of an arm of a given type and the intermediate node of the arm that is a twin of the other same-type arm of the same cell have the effect of discharging the drain/substrate parasitic capacitance of the transistor of the arm adjacent to the conductive arm which is close to the supply terminal. Indeed, for the P type arms, this capacitance connects the higher supply terminal and the intermediate node whereas, for the N type arms, it connects the lower supply terminal and the intermediate node.

It will be observed that the eight new paths created within each cell between the supply terminals and the output node do not affect the logic or electrical functioning of the gate inasmuch as each of these new paths has two transistors receiving, at their control gate respectively, one of the four inputs and its complementary input. Thus, for example, continuing on the subject of the cell 11a, the N type transistor of the arm N10 which is located on the output node side receives the input A while the N type transistor of the arm N21 located on the lower supply terminal side receives the input NA so that the path created by the output XOR and the lower supply terminal through these two transistors is never conductive.

In another advantage, the impedance perceived by each of the four inputs is always identical although the value is different from the one perceived by the four inputs of the prior art gate of FIG. 4.

According to another characteristic of the invention, since the Exclusive-OR gate is made in a single integrated circuit using CMOS technology, the width of the channel of the P type transistors is 2.5 times greater than the width of the channel of the N type transistors. Consequently, compensation is provided for the fact that the charging current of the P type transistors is low as compared with the charging current of the N type transistors because of the difference in mobility of the charging carriers in each type of transistor. This arrangement is planned so that the two outputs XOR and NXOR of the gate 11 switch over symmetrically in a substantially simultaneous way. This is particularly advantageous when the Exclusive-OR gate is designed to be used in a tree of identical gates.

The invention also relates to a frequency multiplier of the type presented in the introduction to this description where the tree of Exclusive-OR gates was formed with gates according to FIG. 5. It will be noted that it is necessary to generate the logic complementary signals of the sampled signals which are applied to the input of the Exclusive-OR gates of the first layer of the tree. These complementary signals are also received by the inputs of the tree. One means of generating these complementary signals without introducing any delay between the switching of the signal and that of its complementary signal is described for example in the document EP-A-0 660 525.

Through the invention, the periods of time taken for the propagation of the signal edges through the tree of Exclusive-OR gates are equalized, whatever the development of the logic state of the inputs, with a precision of about two picoseconds. The invention therefore procures a substantial result which has been verified.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. An Exclusive-OR gate having four, two-by-two complementary, inputs A and NA, and B and NB and two complementary outputs, XOR and NXOR, the Exclusive-OR gate comprising:

a first supply node;

a second supply node; and a first cell and a second cell, each cell comprising:

an output node;

a first P type arm and a second P type arm, the two P type arms being parallel-connected, and each of the two P type arms comprising a first P type MOS transistor and a second P type MOS transistor, the two P type MOS transistors being series-connected between the output node of that cell and the first supply node, with the node between the two series-connected P type MOS transistors being an intermediate node; and a first N type arm and a second N type arm, the two N type arms being parallel-connected, and each of the two N type arms comprising a first N type MOS transistor and a second N type MOS transistor, the two N type MOS transistors being series-connected between the output node of that cell and the second supply node, with the node between the two series-connected N type MOS transistors being an intermediate node; and potential imposing means for preventing at least one of the intermediate nodes from being in a floating state for all possible transitions of the logic states of the inputs, wherein:

the control gates of the two transistors of each of the first P type arm, the second P type arm, the first N type arm, and the second N type arm of each cell are coupled to receive one of the four pairs of inputs {A,B}, {NA,B}, {A,NB}, or {NA,NB} or the reverse of one of these four pairs;

the two same-type arms of a cell receive two-by-two complementary input pairs;

the two N type arms of the first cell are coupled to receive the same pairs of inputs as the two P type arms of the second cell; and the two P type arms of the first cell are coupled to receive the same pairs of inputs as the two N type arms of the second cell.

2. The Exclusive-OR gate of claim 1, wherein:

the Exclusive-OR gate further comprises, for each cell:

a first P type twin arm, which has two series-connected P type MOS transistors with the node between the two series-connected transistors being an intermediate node, that is parallel-connected to the first P type arm, and wherein the first and second transistors of the first P type twin arm are coupled to receive at their control gates the reverse of the pair of inputs that the first P type arm is coupled to receive at the control gates of its transistors;

a second P type twin arm, which has two series-connected P type MOS transistors with the node between the two series-connected transistors being an intermediate node, that is parallel-connected to the second P type arm, and wherein the first and second transistors of the second P type twin arm are coupled to receive at their control gates the reverse of the pair of inputs that the second P type arm is coupled to receive at the control gates of its transistors;

a first N type twin arm, which has two series-connected N type MOS transistors with the node between the two series-connected transistors being an intermediate node, that is parallel-connected to the first N type arm, and wherein the first and second transistors of the first N type twin arm are coupled to receive at their control gates the reverse of the pair of inputs that the first N type arm is coupled to receive at the control gates of its transistors; and a second N type twin arm, which has two series-connected N type MOS transistors with the node between the two series-connected transistors being an intermediate node, that is parallel-connected to the second N type arm, and wherein the first and second transistors of the second N type twin arm are coupled to receive at their control gates the reverse of the pair of inputs that the second N type arm is coupled to receive at the control gates of its transistors; and the potential imposing means comprises, for at least one cell, a connection between the intermediate node of at least one of the first or second arms of either type and the intermediate node of the arm that is the twin of the other same-type arm of the cell.

3. The Exclusive-OR gate of claim 2, wherein:

the potential imposing means comprises, for each cell, a connection between the intermediate node of each of the first and second arms of each type and the intermediate node of the arm that is the twin of the other same-type arm of the cell.

4. The Exclusive-OR gate of claim 1, wherein:

the first supply node is designed to be electrically connected to a higher supply voltage; and the second supply node is designed to be electrically connected to a lower supply voltage.

5. The Exclusive-Or gate of claim 1, wherein the channel width of the P type MOS transistors is greater than that of the N type MOS transistors.

6. The Exclusive-OR gate of claim 5, wherein the channel width of the P type MOS transistors is approximately 2.5 times greater than that of the N type MOS transistors.

7. A frequency multiplier comprising:

a sequence of delay circuits to generate N sampling signals phase-shifted in time from a clock signal with a given frequency $f_o$;

sampling means for sampling a word of N information bits, wherein the N information bits are to be transmitted in series, and the sampling means utilizes the N sampling signals, and the sampling means produces N sampled signals; and a tree of Exclusive-Or gates with four two-by-two complementary inputs and two complementary outputs, wherein the tree of gates receives the N sampled signals and their logic complementary signals at its inputs, and the Exclusive-Or gates of the tree are Exclusive-Or gates according to claim 1.

8. The frequency multiplier of claim 7, wherein:

there are at least N delay circuits;

N is a power of 2 such that $N=2^p$; and there are at least N−1 Exclusive-OR gates in the tree arranged such that:

the first level has $2^{p-1}$ gates;

each first level gate receives 2 of the N sampled signals and their logic complementary signals;

each successive level of the tree has half as many gates as the previous level; and each gate in a successive level receives the output signal and the complementary output signal from two of the gates from the previous level.

9. The frequency multiplier of claim 8, wherein the sampling means comprises N flip-flops that are each latched with one of the N sampling signals.

10. The frequency multiplier of claim 7, wherein:

there are N–1 delay circuits in the sequence; and the N sampling signals comprise the output of the N–1 delay circuits and the signal that feeds the first delay circuit in the sequence.

11. An Exclusive-OR gate having four, two-by-two complementary, inputs A and NA, and B and NB and two complementary outputs, XOR and NXOR, the Exclusive-OR gate comprising:

a first supply node;

a second supply node; and a first cell and a second cell, each cell comprising:

an output node;

a first P type arm and a second P type arm, the two P type arms being parallel-connected, and each of the two P type arms comprising a first P type MOS transistor and a second P type MOS transistor, the two P type MOS transistors being series-connected between the output node of that cell and the first supply node, with the node between the two series-connected P type MOS transistors being an intermediate node; and a first N type arm and a second N type arm, the two N type arms being parallel-connected, and each of the two N type arms comprising a first N type MOS transistor and a second N type MOS transistor, the two N type MOS transistors being series-connected between the output node of that cell and the second supply node, with the node between the two series-connected N type MOS transistors being an intermediate node, and potential imposing means for imposing a potential on at least one of the intermediate nodes when the logic states of the inputs cause the two series-connected transistors of the arm that includes the at least one intermediate node to be non-conductive, wherein:

the control gates of the two transistors of each of the first P type arm, the second P type arm, the first N type arm, and the second N type arm of each cell are coupled to receive one of the four pairs of inputs {A,B}, {NA,B}, {A,NB}, or {NA,NB} or the reverse of one of these four pairs;

the two same-type arms of a cell receive two-by-two complementary input pairs;

the two N type arms of the first cell are coupled to receive the same pairs of inputs as the two P type arms of the second cell; and the two P type arms of the first cell are coupled to receive the same pairs of inputs as the two N type arms of the second cell.

12. The Exclusive-OR gate of claim 11, wherein:

the Exclusive-OR gate further comprises, for each cell:

a first P type twin arm, which has two series-connected P type MOS transistors with the node between the two series-connected transistors being an intermediate node, that is parallel-connected to the first P type arm, and wherein the first and second transistors of the first P type twin arm are coupled to receive at their control gates the reverse of the pair of inputs that the first P type arm is coupled to receive at the control gates of its transistors;

a second P type twin arm, which has two series-connected P type MOS transistors with the node between the two series-connected transistors being an intermediate node, that is parallel-connected to the second P type arm, and wherein the first and second transistors of the second P type twin arm are coupled to receive at their control gates the reverse of the pair of inputs that the second P type arm is coupled to receive at the control gates of its transistors;

a first N type twin arm, which has two series-connected N type MOS transistors with the node between the two series-connected transistors being an intermediate node, that is parallel-connected to the first N type arm, and wherein the first and second transistors of the first N type twin arm are coupled to receive at their control gates the reverse of the pair of inputs that the first N type arm is coupled to receive at the control gates of its transistors; and a second N type twin arm, which has two series-connected N type MOS transistors with the node between the two series-connected transistors being an intermediate node, that is parallel-connected to the second N type arm, and wherein the first and second transistors of the second N type twin arm are coupled to receive at their control gates the reverse of the pair of inputs that the second N type arm is coupled to receive at the control gates of its transistors; and the potential imposing means comprises for at least one cell, a connection between the intermediate node of at least one of the first or second arms of either type and the intermediate node of the arm that is the twin of the other same-type arm of the cell.

13. The Exclusive-OR gate of claim 12, wherein:

the potential imposing means comprises, for each cell, a connection between the intermediate node of each of the first and second arms of each type and the intermediate node of the arm that is the twin of the other same-type arm of the cell.

14. A frequency multiplier comprising:

a sequence of delay circuits to generate N sampling signals phase-shifted in time from a clock signal with a given frequency;

sampling means for sampling a word of N information bits, wherein the N information bits are to be transmitted in series and the sampling means utilizes the N sampling signals, and the sampling means produces N sampled signals; and a tree of Exclusive-Or gates with four two-by-two complementary inputs and two complementary outputs, wherein the tree of gates receives the N sampled signals and their logic complementary signals at its inputs, and the Exclusive-Or gates of the tree are Exclusive-Or gates according to claim 11.

15. The frequency multiplier of claim 14, wherein:

there are at least N delay circuits;

N is a power of 2 such that N=2p; and there are at least N–1 Exclusive-OR gates in the tree arranged such that:

the first level has 2p–1 gates:

each first level gate receives 2 of the N sampled signals and their logic complementary signals;

each successive level of the tree has half as many gates as the previous level; and each gate in a successive level receives the output signal and the complementary output signal from two of the gates from the previous level.

16. The frequency multiplier of claim 15, wherein the sampling means comprises N flip-flops that are each latched with one of the N sampling signals.

17. The frequency multiplier of claim 14, wherein:

there are N−1 delay circuits in the sequence; and the N sampling signals comprise the output of the N−1 delay circuits and the signal that feeds the first delay circuit in the sequence.

* * * * *